United States Patent
Wang et al.

(10) Patent No.: US 7,776,506 B2
(45) Date of Patent: Aug. 17, 2010

(54) COATING COMPOSITIONS FOR PHOTORESISTS

(75) Inventors: Deyan Wang, Hudson, MA (US); Peter Trefonas, III, Medway, MA (US); Michael K. Gallagher, Hopkinton, MA (US)

(73) Assignee: Rohm and Haas Electronic Materials LLC, Marlborough, MA (US)

( * ) Notice: Subject to any disclaimer, the term of this patent is extended or adjusted under 35 U.S.C. 154(b) by 310 days.

(21) Appl. No.: 11/651,090

(22) Filed: Jan. 8, 2007

(65) Prior Publication Data

US 2007/0160930 A1   Jul. 12, 2007

Related U.S. Application Data

(60) Provisional application No. 60/757,345, filed on Jan. 8, 2006.

(51) Int. Cl.
*G03C 1/76* (2006.01)
*G03C 1/492* (2006.01)
*G03C 1/494* (2006.01)
*G03C 5/00* (2006.01)

(52) U.S. Cl. .................... 430/270.1; 430/311; 430/312; 430/319; 430/325

(58) Field of Classification Search ............. 430/270.1, 430/311–312, 319, 325
See application file for complete search history.

(56) References Cited

U.S. PATENT DOCUMENTS

2006/0110677 A1 *   5/2006   Houlihan et al. ......... 430/270.1

* cited by examiner

*Primary Examiner*—Geraldina Visconti
(74) *Attorney, Agent, or Firm*—Peter F. Corless; Darryl P. Frickey; Edwards Angell Palmer & Dodge LLP

(57) ABSTRACT

In one aspect, the present invention relates to coating compositions that comprise a resin component, wherein the predominant portion of the resin component comprising one or more resins that are at least substantially free of fluorine. Coating compositions of the invention are useful as photoresist overcoat layers, including in immersion lithography processing.

8 Claims, No Drawings

COATING COMPOSITIONS FOR PHOTORESISTS

In one aspect, the present invention relates to coating compositions that comprise a resin component, wherein the predominant portion of the resin component comprises one or more resins that are at least substantially free of fluorine. Coating compositions of the invention also are useful as photoresist overcoat layers, including in immersion lithography processing. Preferred coating compositions of the invention also are useful for antireflective purposes, particularly with an associated photoresist coating layer. In a particular aspect, top (overcoated) antireflective compositions are provided.

Photoresists are photosensitive films used for transfer of an image to a substrate. A coating layer of a photoresist is formed on a substrate and the photoresist layer is then exposed through a photomask to a source of activating radiation. The photomask has areas that are opaque to activating radiation and other areas that are transparent to activating radiation. Exposure to activating radiation provides a photoinduced chemical transformation of the photoresist coating to thereby transfer the pattern of the photomask to the photoresist coated substrate. Following exposure, the photoresist is developed to provide a relief image that permits selective processing of a substrate.

A major use of photoresists is in semiconductor manufacture where an object is to convert a highly polished semiconductor slice, such as silicon or gallium arsenide, into a complex matrix of electron conducting paths, preferably of micron or submicron geometry, that perform circuit functions. Proper photoresist processing is a key to attaining this object. While there is a strong interdependency among the various photoresist processing steps, exposure is believed to be one of the most important steps in attaining high resolution photoresist images.

Reflection of activating radiation used to expose a photoresist often poses limits on resolution of the image patterned in the photoresist layer. Light scattering or interference caused by light reflecting from an interface between two layers with differing refractive indices, such as between resist and underlying substrate interface or resist and air interface can result in undesired alterations of the dimensions of the exposed region of a photoresist coating layer. Preferred refractive indices of top anti reflective layers have been calculated from the following equation:

$$n_{TARC} = \sqrt{n_{Resist} \times n_{Air}}$$

Several efforts have been made to reduce such undesired radiation reflections, including use of antireflective layers positioned under a photoresist layer (often referred to as "bottom" antireflective layers) as well as antireflective layers positioned above a photoresist layer (often referred to as "top" antireflective layers).

Electronic device manufacturers continually seek increased resolution of a photoresist image patterned over antireflective coating layers and in turn demand ever-increasing performance from an antireflective composition.

An approach to achieving smaller feature sizes is to use shorter wavelengths of light, however, the difficulty in finding materials that are transparent below 193 nm has led to the option of using immersion lithography to increase the numerical aperture of the lens by simply using a liquid to focus more light into the film. Immersion lithography employs a relatively high refractive index fluid between the last surface of an imaging device (e.g., KrF or ArF stepper) and the first surface on a wafer or other substrate.

Efforts have been made to develop materials for immersion lithography. See U.S. 2005/0238991. However, improved materials are clearly needed to meet lithographic performance levels demanded by electronic device manufacturers.

It thus would be desirable to new materials for microlithography, including compositions useful as photoresist barrier layers and in immersion lithography and antireflective applications.

We now provide new coating compositions that can be particularly useful for as a barrier coat or immersion barrier layer or antireflective layer for an associated photoresist composition layer.

In one aspect, coating compositions of the invention comprise a resin component, wherein the predominant portion of the resin component comprising one or more resins that are at least substantially free of fluorine.

As referred to herein, one or more resins will constitute a "predominant portion" of a resin component of a coating composition where the one or more resins constitute at least 40 weight percent of all polymeric materials present in the coating composition. Generally, more preferred is where the one or more resins constitute at least 50, 60 or 70 weight percent of all polymeric materials present in the coating composition. For clarity, carrier solvent component of a coating composition is not considered in such resin weight percent determinations.

A variety of resins that are at least substantially fluorine-free can be employed in the coating compositions of the invention. Preferred resins may comprise polymerized acrylate repeat units, polymerized maleate repeat units, polymerized anhydride repeat units and/or polymerized cyclic olefin repeat units such as polymerized norbornyl repeat units. For many applications, particularly preferred are resins that contain multiple, distinct repeat units, i.e. copolymers (two distinct repeat units), terpolymers (three distinct repeat units) and terpolymers (four distinct repeat units).

In a certain embodiment, the coating composition resin component comprises one or more resins that comprises acrylate groups co-polymerized with non-acrylate groups such as polymerized cyclic olefin, vinylalcohol, maleate, and/or anhydride groups.

In a further embodiment, the coating composition resin component comprises one or more resins which do not have functional groups which can undergo photoacid-induced bonding breaking reactions, i.e. the one or more resins do not contain photoacid-labile groups such as e.g. tert-butyl esters which may be provided by polymerization of a tert-butyl acrylate.

In a further embodiment, the coating composition resin component comprises one or more resins which do not have acidic functional groups such as carboxy groups which may be provided by e.g. polymerization of an acrylic acid.

In a further embodiment, the coating composition of the invention comprises a plurality of distinct resins. For example, in one preferred aspect, the coating composition comprises a first resin that is at least substantially free of fluorine atoms and a second distinct resin, which may be fluorinated.

Preferred are coating compositions that comprise one or more acids (organic or inorganic) and/or acid generator compounds such as a thermal acid generator compound or a photoacid generator compound. Preferred added acids or acid generator compounds do not include amine or other nitrogen or other basic substitution.

Preferred coating compositions also may optionally comprise a fluorinated component, which may be polymeric or non-polymeric. If present as a polymeric material, as discussed above, the fluorinated resin will be present in a weight percent lower relative to substantially non-fluorinated resin(s) present in the coating composition.

Coating compositions of the invention also may further comprise one or more components that comprise one or more groups containing of silicon, boron, aluminum, yttrium, lanthanum, tin, titanium, zirconium, hafnium and/or zinc, with Si, Hf and/or Zr being preferred. Coating components that comprise a silicon-containing component are particularly preferred. Preferred silicon-containing component of such coating compositions of the invention will have a high Si content, e.g. at least 10, 20, 30, 50 or 50 atom weight percent of the total component being Si. Preferred silicon-containing components also may have a relatively high portion of silicon oxide, silicon nitride, or silicon carbide repeat units.

Particularly preferred applied coating compositions of the invention can be removed by disposing an aqueous coating compositions such as an alkaline developer or a fluoride salt composition.

Coating compositions of the invention are suitably formulated as fluid compositions, e.g. as organic solvent-based or organic solvent/aqueous-based or aqueous-based compositions. Preferred organic solvents include those that aqueous-miscible such as an alcohol e.g. $C_{2-16}$ alcohols, ethers, glycol ethers, ketones, esters, carboxylic acids such as acetic acid.

In a yet further aspect of the invention, coating compositions are provided that are substantially free (e.g. less than 10, 5 or 2 weight percent of fluid composition) or completely free of fluorinated components, particularly a fluorinated resin.

In a preferred aspect of the invention, coated substrates are provided including a coated substrate comprising: (a) a coating layer of a photoresist composition; and (b) above the photoresist composition, an applied coating composition as described herein.

In additional preferred aspects, the invention includes methods for processing an electronic device substrate, comprising (a) applying a photoresist layer on substrate; and (b) applying above the photoresist layer a coating composition as described herein.

Coating compositions of the invention suitably may be applied to a surface (e.g. over a photoresist coating layer) by any number of means, including dip coating, roller coating, slot coating, spray coating, chemical vapor deposition or preferably spin coating. After application of a coating composition of the invention, a multilayer system (i.e. photoresist layer with overcoated layer of a coating composition of the invention) may directly further lithographically processed (e.g. imaged with patterned activating radiation such as having a wavelength of 365 nm, 248 nm or 193 nm), or the applied coating layer may be cured otherwise set such as by thermal treatment e.g. 110° C., 120° C. or 140° C. or more for 30 to 60 seconds or more.

More particularly, coating compositions of the invention may be suitably employed in a lithographic process as follows:

1) apply a photoresist composition (e.g. by spin coating) to a substrate such as a semiconductor wafer. The photoresist may be suitably applied on the wafer surface or a material previously applied over the wafer such as an organic or inorganic planarizing layer;

2) optionally thermally treat the applied photoresist composition to remove solvent carrier, e.g. at 120° C. or less for 30 to 60 seconds;

3) above the photoresist composition, apply a coating composition of the invention, e.g. by spin coating a fluid formulation of the coating composition. The coated substrate optionally then may be thermally treated to remove solvent carrier of the barrier composition, although in preferred systems the substrate with multiple coating layers can be directly lithographically processed with a further drying step of the overcoated coating composition of the invention;

4) exposing the overcoated photoresist layer to patterned activating radiation e.g. sub-400 nm, sub-300 nm or sub-200 nm radiation such as radiation having a wavelength of 365 nm, 248 nm or 193 nm. The coated substrate also may be imaged in an immersion lithography system with a fluid (e.g. a fluid comprising water) interposed between the exposure tool and the coated substrate, i.e. immersion exposing the photoresist layer by a fluid layer interposed between the exposure tool and the layer of a coating composition of the invention. The interposed fluid typically contacts the overcoated composition layer;

5) developing the exposed coating layers such as with an aqueous alkaline developer composition regularly employed for photoresist development. The developer composition can remove the overcoated coating composition of the invention as well as imaged areas of the photoresist composition in the case of a positive-acting resist, or non-exposed resist coating layer areas in the case of a negative-acting resist.

Also, if desired, during lithographic processing, the coated substrate may be washed with a solvent composition, which can reduce the occurrence of defects on the processed microelectronic wafer. The solvent treatment composition may be an aqueous composition (e.g. water or water/organic mixture) or a non-aqueous component and comprise one or more organic solvents, preferably one or more polar solvents such as one or more alcohols such as isopropanol, and/or more or more additives such as a fluoride compound including an ammonium fluoride compound. After treating a coated substrate, the solvent composition then may be substantially removed such as by further spinning. Suitably, such a wash step may be conducted after exposure, either before or after development, or a fluid composition wash step may be conducted both before or after development. A pre-development wash can effectively remove the coating composition overcoated the photoresist layer, and a post-development wash step to minimize or eliminate any undesired residues remaining on the processed substrate surface.

Preferred imaging wavelengths of lithographic systems of the invention include sub 400 nm-wavelengths such as 365 nm, sub-300 nm wavelengths e.g. 248 nm, and sub-200 nm wavelengths e.g. 193 nm. Higher imaging wavelengths also may be employed.

Particularly preferred photoresists for use in accordance with the invention may contain a photoactive component (e.g. one or more photoacid generator compounds, or a diazonaphthoquinone photoactive component for photoresists imaged at higher wavelengths including wavelengths in excess of 300 nm and 400 nm such as 365 nm and 436 nm) one or more resins that are chosen from among:

1) a phenolic resin that contains acid-labile groups that can provide a chemically amplified positive resist particularly suitable for imaging at 248 nm. Particularly preferred resins of this class include: i) polymers that contain polymerized units of a vinyl phenol and an alkyl acrylate, where the polymerized alkyl acrylate units can undergo a deblocking reaction in the presence of photoacid. Exemplary alkyl acrylates that can undergo a photoacid-induced deblocking reaction include e.g. t-butyl acrylate, t-butyl methacrylate, methyladamantyl acrylate, methyl adamantyl methacrylate, and other non-cyclic alkyl and alicyclic acrylates that can undergo a photoacid-induced reaction, such as polymers in U.S. Pat. Nos. 6,042,997 and 5,492,793; ii) polymers that contain polymerized units of a vinyl phenol, an optionally substituted vinyl phenyl (e.g. styrene) that does not contain a hydroxy or carboxy ring substituent, and an alkyl acrylate such as those deblocking groups described with polymers i) above, such as polymers described in U.S. Pat. No. 6,042,997; and iii) polymers that contain repeat units that comprise an acetal or ketal moiety that will react with photoacid, and optionally aromatic repeat units such as phenyl or phenolic groups; such polymers have been described in U.S. Pat. Nos. 5,929,176 and 6,090,526, as well as blends of i) and/or ii) and/or iii);

2) phenolic resins that do not contain acid-labile groups such as poly(vinylphenol) and novolak resins that may be employed in I-line and G-line photoresists together with a diazonaphthoquinone photoactive compound and have been described e.g. in U.S. Pat. Nos. 4,983,492; 5,130,410; 5,216,111; and 5,529,880;

3) a resin that is substantially or completely free of phenyl or other aromatic groups that can provide a chemically amplified positive resist particularly suitable for imaging at sub-200 nm wavelengths such as 193 nm. Particularly preferred resins of this class include: i) polymers that contain polymerized units of a non-aromatic cyclic olefin (endocyclic double bond) such as an optionally substituted norbornene, such as polymers described in U.S. Pat. Nos. 5,843,624, and 6,048,664; ii) polymers that contain alkyl acrylate units such as e.g. t-butyl acrylate, t-butyl methacrylate, methyladamantyl acrylate, methyl adamantyl methacrylate, and other non-cyclic alkyl and alicyclic acrylates; such polymers have been described in U.S. Pat. No. 6,057,083; European Published Applications EP01008913A1 and EP00930542A1; and U.S. pending patent application Ser. No. 09/143,462; and iii) polymers that contain polymerized anhydride units, particularly polymerized maleic anhydride and/or itaconic anhydride units, such as disclosed in European Published Application EP01008913A1 and U.S. Pat. No. 6,048,662, as well as blends of i) and/or ii) and/or iii);

4) a resin that contains repeat units that contain a hetero atom, particularly oxygen and/or sulfur (but other than an anhydride, i.e. the unit does not contain a keto ring atom), and preferable are substantially or completely free of any aromatic units. Preferably, the heteroalicyclic unit is fused to the resin backbone, and further preferred is where the resin comprises a fused carbon alicyclic unit such as provided by polymerization of a norborene group and/or an anhydride unit such as provided by polymerization of a maleic anhydride or itaconic anhydride. Such resins are disclosed in PCT/US01/14914 and U.S. application Ser. No. 09/567,634.

5) Resins that contain Si-substitution including poly(silsequioxanes) and may be used with an undercoated layer. Such resins are disclosed e.g. in U.S. Pat. No. 6,803,171.

6) A resin that contains fluorine substitution (fluoropolymer), e.g. as may be provided by polymerization of tetrafluoroethylene, a fluorinated aromatic group such as fluoro-styrene compound, compounds that comprise a hexafluoroalcohol moiety. Examples of such resins are disclosed e.g. in PCT/US99/21912. Such fluorinated resins may be particularly useful for imaging at short wavelengths such as sub 300 nm and sub-200 nm, including 193 nm and 157 nm.

The invention further provides methods for forming a photoresist relief image and producing an electronic device. The invention also provides novel articles of manufacture comprising substrates coated with a coating composition of the invention alone or in combination with a photoresist composition.

Other aspects of the invention are disclosed infra.

We now provide new coating compositions that can be particularly useful as barrier coat or immersion barrier layer as well as an antireflective layer between a radiation source and a photoresist layer.

As discussed above, in one aspect, coating compositions of the invention comprise a resin component, wherein the predominant portion of the resin component comprising one or more resins that are at least substantially free of fluorine.

As also discussed above, as referred to herein, one or more resins will constitute a "predominant portion" of a resin component of a coating composition where the one or more resins constitute at least 40 weight percent of all polymeric materials present in the coating composition. Generally, more preferred is where the one or more resins constitute at least 50, 60 or 70 weight percent of all polymeric materials present in the coating composition.

Additionally, as referred to herein, a resin or other material that is "at least substantially free of fluorine" will constitute less than 5 weight percent fluorine, more typically 4, 3, 2, 1 or 0.5 or less weight percent fluorine. For many applications, a resin or other material that is at least substantially free of fluorine will be completely free of fluorine.

Suitable resins that are at least substantially free of fluorine for use in a coating composition may include e.g. acrylate polymers (including polymerized acrylate acids and acrylate esters); polymerized anhydrides; poly(vinylalcohols); polymerized anhydride groups; polymerized cyclic olefins such as fluorinated norbornyl groups, polymerized aromatic groups such as polymerized styrene and polymerized naphthylene; and polymers comprising mixtures of such units.

Exemplary resins that are at least substantially free of fluorine for use in a coating composition include methylmethacrylate-mono-n-butylmaleate-isonorbornylacrylate terpolymer;
poly(vinylalcohol-co-vinylacetate);
poly(methacrylic acid-co-methyl methacrylate-co-2-acrylamido-2-methylpropanesulfonic acid);
poly(methacrylic acid-co-hydroxy ethyl acrylate-co-2-acrylamido-2-methylpropanesulfonic acid);
poly(methacrylic acid-co-methyl methacrylate);
poly(vinyl acetate-co-butyl maleate-co-isobornyl acrylate);
poly(tert butyl acrylate-co-methyl methacrylate-co-methacrylic acid);
poly(tert butyl acrylate-co-methyl methacrylate-co-acrylic acid);
poly(methacrylic acid-co-methyl methacrylate-co-2-acrylamido-2-methylpropanesulfonic acid);
poly(tert butyl methacrylate-co-methyl acrylate-co-methacrylic acid);
poly(tert butyl methacrylate-co-methacrylic acid);
poly(methacrylic acid-co-methyl methacrylate-co-2-acrylamido-2-methylpropanesulfonic acid);
poly(tert butyl methacrylate-co-methyl methacrylate-co-methacrylic acid);
poly(styrene-co-maleic anhydride);
poly(methyl vinyl ether-alt-maleic anhydride);
poly(tert-butyl acrylate-co-ethyl acrylate-co-methacrylic acid;
poly(styrene-co-maleic anhydride) which may be esterified;
Poly(maleic anhydride-alt-1-octadecene); and
poly(isobutylene-alt-maleic anhydride)

Preferred coating compositions of the invention are removable during lithographic processing, including with an aqueous alkaline developer that may be employed to develop (remove) exposed regions of an undercoated positive-acting photoresist layer. Preferred coating compositions of the invention also can be employed without cross-linking or other hardening of a coating composition layer. Thus, preferred coating compositions of the invention can be free of a crosslinker component, or other material that otherwise would be employed to facilitate curing of the composition coating layer.

However, preferred coating compositions of the invention may comprise one or more components that may undergo crosslinking (covalent bond formation) during lithographic processing.

As discussed further below, coating compositions of the invention may comprise organic and/or inorganic components. Preferred coating compositions of the invention are formulated as fluid compositions, e.g. fluid compositions where the only solvent carrier is one or more organic solvents as well as fluid compositions that may comprise water optionally admixed with one or more other miscible fluid components including one or more water-miscible organic solvents such as one or more alcohol solvents.

Preferred coating compositions of the invention also will be substantially free of trace metals. For example, preferred coating compositions of the invention will have undesired metals at levels of less than 1 ppm, preferably less than 100 ppb. Undesired metals may include heavy metals, alkali metals such as sodium, transitional and/or rare earth metals. Preferred coating compositions of the invention also will have such low levels of other undesired materials such as chloride ions.

As discussed above, preferred coating compositions of the invention are disposed from solution, and more preferably from organic or aqueous solutions as discussed above. Coating compositions also may be disposed on a surface by other methods including chemical vapor deposition, spray coating, "ink-jetting", spray pyrolysis or other processes for disposing thin film onto a substrate.

Optional Additives

Preferred coating compositions of the invention suitably may optionally comprise one or more materials in addition to the above discussed resin component.

As discussed above, a particularly preferred additive for coating compositions of the invention will be one or more acids and/or acid generator compounds.

Suitable acid additives can be both organic and inorganic acids. Exemplary acid additives include e.g. nitric acid, sulfuric acid, trichloroacetic acid, trifluoroacetic acid, oxalic acid, maleic acid, malonic acid, succinic acid, maleic acid, citric acid, tartaric acid, para toluene sulfonic acid, trifluoromethylbenzenesulfonic acid, camphor sulfonic acid, and trifluoromethane sulfonic acid.

As discussed above, preferred added acids or acid generator compounds do not include amine or other nitrogen or other basic substitution. Thus, amino acids are less preferred additives and excluded from certain preferred aspects of the invention.

Suitable amounts of one or more acids in a coating composition of the invention may vary within a wide range and may be readily optimized for any particular composition by simple testing (e.g. by evaluating resolution of undercoated imaged photoresist) and consideration of factors such as acid pKa, mobility and size. Suitable acid loading levels may include less than 5 weight percent of the fluid coating composition, more preferably less than 1 weight percent of the fluid coating composition, and even more preferably less than 0.5% by weight of fluid coating composition, such as within a range of from 0.1 to 0.4 weight percent of the fluid coating composition.

Suitable acid generator compounds include photoacid generator compounds and thermal acid generator compounds. Exemplary thermal acid generator compounds include both ionic as well as substantially neutral thermal acid generators, e.g. an ammonium arenesulfonate salt. Suitable thermal acid generator compounds are commercially available such as from King Industries. Suitable photoacid generator compounds to employ in a coating composition include onium salts, particularly iodonium and sulfonium compounds such as those discussed below with respect to photoresists. Other photoacid generator compounds identified below for use in connection with photoresists can be employed in an overcoated coating composition of the invention. If used, one or more acid generators may be suitably present in a coating composition in a concentration from 0.1 to 10 percent by weight of the total of the dry components of the coating composition (all components except solvent carrier), more preferably 0.1 to 2 percent by weight of the total dry components.

Preferred optional coating composition components also include one or more additional resins. A wide variety of resin components may be suitably employed. For example, suitable resins include those that polar functional groups on one or more repeat units, particularly functional groups that can impart water solubility or dispersiblity such as hydroxy, carboxy (—COOH), and sulfonyl ($>SO_2$). Exemplary resin additives include poly(vinylalcohols), polyethylene oxide (PEO), polypropylene oxide (PPO), polytetrahydrofuran, PEO-PPO (co, block, triblock polymers), glycerol-tri-(PEO-PPO), polyacrylic acid), poly(methacrylic acid), poly(methyl vinyl ether), poly(vinyl pyrrolidone), poly(allylamine), poly(ethyleneimine), poly(acrylamide), poly(maleic acid), poly(vinylacetate), urethane resins such as poly(urethane diol), cellulose-based resins such as hydroxypropyl cellulose and hydroxyethyl cellulose, as well as copolymers of these materials. Also, the resins may be suitably in salt form, e.g. used in ammonium salt form.

Suitable resin additives are commercially available.

As also discussed above, a preferred additive is a fluorinated material, which may be a polymer or a non-polymeric component. Fluorinated polymers will be present in a minor portion relative to resins that are at least substantially free of fluorine and present in the coating composition.

Suitable fluorinated resins for use in a coating composition may include e.g. fluorinated acrylate polymers; fluorinated poly(vinylalcohols); polymerized anhydride groups; polymers containing fluorinated polymerized cyclic olefins such as fluorinated norbornyl groups, and polymers comprising mixtures of such units.

Exemplary fluorinated polymers include poly(pentafluoropropylacrylate-co-t-butyl methacrylate-co-trimethylpropanetrimethacrylate);

poly(pentafluoropropylacrylate-co-t-butyl acrylate-co-ethylenglycoldimethacrylate);

poly(allylhexfluoro alcohol-co-methacrylic acid-co-ethylenglycoldimethacrylate);

poly(allylhexfluoro alcohol-co-t-butyl acrylate-co-ethylenglycoldimethacrylate);

poly(allylhexfluoro alcohol-co-t-butylmethacrylate-co-ethylenglycoldimethacrylate);

poly(trifluoroethyl acrylate-co-t-butyl methacrylate-co-trimethylpropanetrimethacrylate);

poly(hexafluoro-2-propyl acrylate-co-t-butyl methacrylate-co-trimethylpropanetrimethacrylate);

poly(heptafluoro-2-propyl acrylate-co-t-butyl methacrylate-co-trimethylpropanetrimethacrylate);

poly(heptafluoro-2-propyl allylether-co-t-butyl methacrylate-co-trimethylpropanetrimethacrylate);
poly(bis(hexafluoro-2-propyl) itaconate-co-t-butyl methacrylate-co-trimethylpropanetrimethacrylate); and
poly(3,5bis(hexafluoro-2-hydroxy-2-propyl)cyclohexyl-methacrylate-co-t-butyl methacrylate-co-trimethylpropanetrimethacrylate).

As discussed above, coating compositions also may optionally comprise a component that comprise one or more of silicon, boron, aluminum, yttrium, lanthanum, tin, titanium, zirconium, hafnium and/or zinc, with a silicon-containing Hf-containing or Zr-containing component (e.g. colloidal silica, $HfO_2$ or $ZrO_2$ particles) being preferred for many applications. Preferred silicon-containing components will have a high Si content, e.g. at least 10, 20, 30, 50 or 50 atom weight percent of the total component being Si. Preferred silicon-containing components also may have a relatively high portion of $SiO_2$ repeat units, e.g. where at least 20 percent of total polymer units of an Si-containing polymer are $SiO_2$, or where at least 40, 50, 60, 70, 80, 90 or 100 percent of total number of polymer units of an Si-containing polymer are $SiO_2$.

Such composition components that contain one or more of silicon, boron, aluminum, yttrium, lanthanum, tin, titanium, zirconium, hafnium and/or zinc compounds may be organic or inorganic. Inorganic components particularly suitable for the present invention include one or more oxide of silicon, zirconium or hafnium e.g. $SiO_2$, $HfO_2$ or $ZrO_2$. Such moieties also may be surface functionalized e.g. to improve the stability of the particle dispersion with organic groups such as $C_{1-20}$alkyl, $C_{1-20}$alkoxy, and/or $C_{1-20}$thioalkyl grafted thereon.

While inorganic materials or surface-modified inorganic materials may be preferred for many applications, organic polysilica components also may be employed in an over-coated coating compositions of the invention and may be prepared using a partial condensate of one or more organosilanes and one or more silicon-containing cross-linking agents, wherein the cross-linking agent contains >4 hydrolyzable groups. Suitable silicon-containing cross-linking agents have 5 or 6 hydrolyzable groups. As used herein, the term "partial condensate" refers to a silane oligomer or prepolymer or hydrolyzate that is capable of undergoing further condensation reactions to increase its molecular weight.

If utilized for control undesired reflections of exposure radiation, coating compositions of the invention also may comprise one or more chromophore groups that can significantly absorb radiation used to image an underlying photoresist composition layer. Typically suitable chromophore groups are aromatic groups, particularly carbocyclic aryl groups such as phenyl, naphthyl, and anthracenyl. Such groups may be a substituent of the above discussed resin components, or may be a substituent of another polymeric or non-polymeric additive of a coating composition. For coating compositions employed with undercoated photoresist composition that are imaged with 248 nm radiation, preferred chromophore groups include anthracenyl and naphthyl. For coating compositions employed with undercoated photoresist composition that are imaged with 248 nm radiation, preferred chromophore groups include phenyl. In certain preferred embodiments, however, the coating compositions of the invention will not contain such chromophore groups including such carbocyclic aryl or other aromatic chromophore groups.

A further preferred optional additive of a coating composition of the invention is one or more surfactants, which can promote formation of a substantially uniform coating layer of the overcoated composition. A variety of surfactants may be employed. Suitable surfactants may exhibit an amphiphilic nature, meaning that they can be both hydrophilic and hydrophobic at the same time. Amphiphilic surfactants possess a hydrophilic head group or groups, which have a strong affinity for water and a long hydrophobic tail, which is organophilic and repels water. Suitable surfactants may be ionic (i.e., anionic, cationic) or nonionic. Further examples of surfactants include silicone surfactants, poly(alkylene oxide) surfactants, and fluorochemical surfactants. Suitable non-ionic surfactants for use in the aqueous solution include, but are not limited to, octyl and nonyl phenol ethoxylates such as TRITON® X-114, X-102, X-45, X-15 and alcohol ethoxylates such as BRIJ® 56 ($C_{16}H_{33}(OCH_2CH_2)_{10}OH$)(ICI), BRIJ® 58 ($C_{16}H_{33}(OCH_2CH_2)20OH$)(ICI). Still further exemplary surfactants include alcohol (primary and secondary) ethoxylates, amine ethoxylates, glucosides, glucamine, polyethylene glycols, poly(ethylene glycol-co-propylene glycol), or other surfactants disclosed in *McCutcheon's Emulsifiers and Detergents*, North American Edition for the Year 2000 published by Manufacturers Confectioners Publishing Co. of Glen Rock, N.J.

Nonionic surfactants that are acetylenic diol derivatives also can be suitable, including such surfactants of the following Formulae I and II:

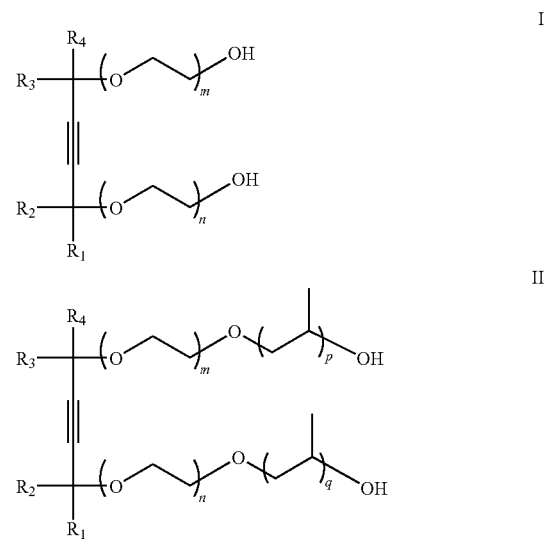

wherein in those Formulae I and II $R_1$ and $R_4$ are a straight or a branched alkyl chain suitably having from 3 to 10 carbon atoms; $R_2$ and $R_3$ are either H or an alkyl chain suitably having from 1 to 5 carbon atoms; and m, n, p, and q are numbers that range from 0 to 20. Such surfactants are commercially available from Air Products and Chemicals, Inc. of Allentown, Pa. trade names of SURFYNOL® and DYNOL®.

Additional suitable surfactants for use in coating compositions of the invention include other polymeric compounds such as the tri-block EO-PO-EO co-polymers PLURONIC® 25R2, L121, L123, L31, L81, L101 and P123 (BASF, Inc.).

Exemplary preferred surfactants for use in coating compositions of the invention include alkyl oxide polymers such as polypropylene/ethylene oxide polymers (Pluronic 25R2); various fluorinated oligomers and polymers (e.g. Polyfox151N and Polyfox156A); various siloxanes (e.g. Silwet 7604); various polyols including acetylenic polyols (e.g. Surfynol 465 and Surfynol 485; Geminol 100); fluorinated compounds including fluoroalkyl telemers (e.g. Megaface R08) and alkyl esters (e.g. Envirogen AE-01).

Formulation of an Overcoated Coating Composition

Coating compositions of the invention may be readily prepared by admixing the above discussed resin component in an organic solvent and/or aqueous composition optionally together with one or more further additives as discussed above, i.e. one or more resins, one or more surfactants, and/or one or more acids and/or acid generator compounds.

Coating compositions may be formulated in a variety of concentrations, with fluid compositions comprising from 0.1 to 30 weight percent total solids (all components except organic solvent and/or water carriers) based on total composition weight being suitable, and more preferred are fluid compositions that comprise from 1 to 10 weight percent total solids, or even 1 to 3, 4 or 5 weight percent total solids, based on total composition weight.

A variety of organic solvents may be employed to formulate an overcoating composition of the invention. Alcohols are preferred for many applications including e.g. $C_{1-16}$alcohols such as butanol including 2-methyl-1-butanol, pentanol, octanol, optionally admixed with one or more other distinct solvents including non-hydroxy solvents such as e.g. cyclohexane and/or cyclohexanone.

Optional surfactants and stabilizing agents suitably may be each employed in relatively small amounts, e.g. from 0.001 to 3 weight percent, based on total weight of the coating compositions. Surfactants may be suitably employed in relatively low amounts e.g. 500 ppm or less based on the total fluid coating composition.

Photoresists

A wide variety of photoresist compositions may be used in combination with coating compositions and processes of the invention.

Preferred photoresists for use in accordance with the invention include positive-acting or negative-acting chemically amplified photoresists, i.e. negative-acting resist compositions which undergo a photoacid-promoted crosslinking reaction to render exposed regions of a coating layer of the resist less developer soluble than unexposed regions, and positive-acting resist compositions which undergo a photoacid-promoted deprotection reaction of acid labile groups of one or more composition components to render exposed regions of a coating layer of the resist more soluble in an aqueous developer than unexposed regions. Ester groups that contain a tertiary non-cyclic alkyl carbon (e.g. t-butyl) or a tertiary alicyclic carbon (e.g. methyladamantyl) covalently linked to the carboxyl oxygen of the ester are often preferred photoacid-labile groups of resins employed in photoresists of the invention. Acetal photoacid-labile groups also will be preferred.

Suitable photoresists may contain resin and photoactive components. Preferably the resin has functional groups that impart alkaline aqueous develop ability to the resist composition. For example, preferred are resin binders that comprise polar functional groups such as hydroxyl or carboxylate. Preferably a resin component is used in a resist composition in an amount sufficient to render the resist developable with an aqueous alkaline solution.

For imaging at wavelengths greater than 200 nm, such as 248 nm, phenolic resins are typically preferred. Preferred phenolic resins are poly(vinylphenols) which may be formed by block polymerization, emulsion polymerization or solution polymerization of the corresponding monomers in the presence of a catalyst. Vinylphenols useful for the production of polyvinyl phenol resins may be prepared, for example, by hydrolysis of commercially available coumarin or substituted coumarin, followed by decarboxylation of the resulting hydroxy cinnamic acids. Useful vinylphenols may also be prepared by dehydration of the corresponding hydroxy alkyl phenols or by decarboxylation of hydroxy cinnamic acids resulting from the reaction of substituted or nonsubstituted hydroxybenzaldehydes with malonic acid. Preferred polyvinylphenol resins prepared from such vinylphenols have a molecular weight range of from 2,000 to 60,000 daltons.

Also preferred for imaging at wavelengths greater than 200 nm, such as 248 nm are chemically amplified photoresists that comprise in admixture a photoactive component and a resin component that comprises a copolymer containing both phenolic and non-phenolic units. For example, one preferred group of such copolymers has acid labile groups substantially, essentially or completely only on non-phenolic units of the copolymer, particularly alkylacrylate photoacid-labile groups, i.e. a phenolic-alkyl acrylate copolymer. One especially preferred copolymer binder has repeating units x and y of the following formula:

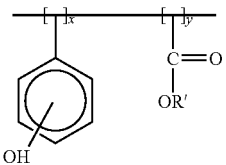

wherein the hydroxyl group be present at either the ortho, meta or para positions throughout the copolymer, and R' is substituted or unsubstituted alkyl having 1 to 18 carbon atoms, more typically 1 to 6 to 8 carbon atoms. Tert-butyl is a generally preferred R' group. An R' group may be optionally substituted by e.g. one or more halogen (particularly F, Cl or Br), $C_{1-8}$ alkoxy, $C_{2-8}$ alkenyl, etc. The units x and y may be regularly alternating in the copolymer, or may be randomly interspersed through the polymer. Such copolymers can be readily formed. For example, for resins of the above formula, vinyl phenols and a substituted or unsubstituted alkyl acrylate such as t-butylacrylate may be condensed under free radical conditions as known in the art. The substituted ester moiety, i.e. R'—O—C(=O)—, moiety of the acrylate units serves as the acid labile groups of the resin and will undergo photoacid induced cleavage upon exposure of a coating layer of a photoresist containing the resin. Preferably the copolymer will have a $M_w$ of from 8,000 to 50,000, more preferably 15,000 to 30,000 with a molecular weight distribution of 3 or less, more preferably a molecular weight distribution of 2 or less. Non-phenolic resins, e.g. a copolymer of an alkyl acrylate such as t-butylacrylate or t-butylmethacrylate and a vinyl alicyclic such as a vinyl norbornanyl or vinyl cyclohexanol compound, also may be used as a resin binder in compositions of the invention. Such copolymers also may be prepared by such free radical polymerization or other known procedures and suitably will have a $M_w$ of from 8,000 to 50,000, and a molecular weight distribution of 3 or less.

Other preferred resins that have acid-labile deblocking groups for use in a positive-acting chemically-amplified photoresist of the invention have been disclosed in European Patent Application 0829766A2 of the Shipley Company (resins with acetal and ketal resins) and European Patent Application EP0783136A2 of the Shipley Company (terpolymers and other copolymers including units of 1) styrene; 2) hydroxystyrene; and 3) acid labile groups, particularly alkyl acrylate acid labile groups such as t-butylacrylate or t-butylmethacrylate). In general, resins having a variety of acid labile groups will be suitable, such as acid sensitive esters, carbonates, ethers, imides, etc. The photoacid labile groups will more typically be pendant from a polymer backbone, although resins that have acid labile groups that are integral to the polymer backbone also may be employed.

For imaging at sub-200 nm wavelengths such as 193 nm, preferably a photoresist is employed that contains one or more polymers that are substantially, essentially or completely free of phenyl or other aromatic groups. For example, for sub-200 nm imaging, preferred photoresist polymers contain less than 5 mole percent aromatic groups, more preferably less than 1 or 2 mole percent aromatic groups, more preferably less than 0.1, 0.02, 0.04 and 0.08 mole percent aromatic groups and still more preferably less than 0.01 mole percent aromatic groups. Particularly preferred polymers are completely free of aromatic groups. Aromatic groups can be highly absorbing of sub-200 nm radiation and thus are undesirable for polymers used in photoresists imaged with such short wavelength radiation.

Suitable polymers that are substantially or completely free of aromatic groups and may be formulated with a photoacid generator compound (PAG) to provide a photoresist for sub-200 nm imaging are disclosed in European application EP930542A1 and U.S. Pat. Nos. 6,692,888 and 6,680,159, all of the Shipley Company.

Suitable polymers that are substantially or completely free of aromatic groups suitably contain acrylate units such as photoacid-labile acrylate units as may be provided by polymerization of methyladamanatylacrylate, methyladamantylmethacrylate, ethylfenchylacrylate, ethylfenchylmethacrylate; fused non-aromatic alicyclic groups such as may be provided by polymerization of a norbornene compound or other alicyclic compound having an endocyclic carbon-carbon double bond; an anhydride such as may be provided by polymerization of maleic anhydride and/or itaconic anhydride.

Preferred negative-acting compositions of the invention comprise a mixture of materials that will cure, crosslink or harden upon exposure to acid, and a photoactive component of the invention. Particularly preferred negative acting compositions comprise a resin binder such as a phenolic resin, a crosslinker component and a photoactive component of the invention. Such compositions and the use thereof has been disclosed in European Patent Applications 0164248 and 0232972 and in U.S. Pat. No. 5,128,232 to Thackeray et al. Preferred phenolic resins for use as the resin binder component include novolaks and poly(vinylphenol)s such as those discussed above. Preferred crosslinkers include amine-based materials, including melamine, glycolurils, benzoguanamine-based materials and urea-based materials. Melamine-formaldehyde resins are generally most preferred. Such crosslinkers are commercially available, e.g. the melamine resins sold by American Cyanamid under the trade names Cymel 300, 301 and 303. Glycoluril resins are sold by American Cyanamid under trade names Cymel 1170, 1171, 1172, urea-based resins are sold under the trade names of Beetle 60, 65 and 80, and benzoguanamine resins are sold under the trade names Cymel 1123 and 1125.

For imaging at sub-200 nm wavelengths such as 193 nm, preferred negative-acting photoresists are disclosed in WO 03077029 to the Shipley Company.

As also discussed above, overcoated coating compositions of the invention suitably may be employed with photoresists imaged with longer wavelength radiation, such as imaging radiation having a wavelength of greater than 300 nm and 400 nm, including 365 nm (I-line) and 436 nm (G-line). For such higher wavelength imaging, preferred are photoresists that comprise a phenolic resin such as a novolak resin and a diazonaphthoquinone photoactive compound.

Photoresists of the invention also may contain other materials. For example, other optional additives include actinic and contrast dyes, anti-striation agents, plasticizers, speed enhancers, sensitizers (e.g. for use of a PAG at longer wavelengths such as I-line (i.e. 365 nm) or G-line wavelengths), etc. Such optional additives typically will be present in minor concentration in a photoresist composition except for fillers and dyes which may be present in relatively large concentrations such as, e.g., in amounts of from 5 to 30 percent by weight of the total weight of a resist's dry components.

A preferred optional additive of resists of the invention is an added base, e.g. a caprolactam, which can enhance resolution of a developed resist relief image. The added base is suitably used in relatively small amounts, e.g. 1 to 10 percent by weight relative to the PAG, more typically 1 to 5 weight percent. Other suitable basic additives include ammonium sulfonate salts such as piperidinium p-toluenesulfonate and dicyclohexylammonium p-toluenesulfonate; alkyl amines such as tripropylamine and dodecylamine; aryl amines such as diphenylamine, triphenylamine, aminophenol, and 2-(4-aminophenyl)-2-(4-hydroxyphenyl)propane.

The resin component of resists useful in accordance with the invention are typically used in an amount sufficient to render an exposed coating layer of the resist developable such as with an aqueous alkaline solution. More particularly, a resin component will suitably comprise 50 to 90 weight percent of total solids of the resist. The photoactive component should be present in an amount sufficient to enable generation of a latent image in a coating layer of the resist. More specifically, the photoactive component will suitably be present in an amount of from 1 to 40 weight percent of total solids of a resist. Typically, lesser amounts of the photoactive component will be suitable for chemically amplified resists.

The resist compositions of the invention also comprise a photoacid generator (i.e. "PAG") that is suitably employed in an amount sufficient to generate a latent image in a coating layer of the resist upon exposure to activating radiation. Preferred PAGs for imaging at 193 nm and 248 nm imaging include imidosulfonates such as compounds of the following formula:

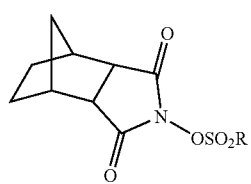

wherein R is camphor, adamantane, alkyl (e.g. $C_{1-12}$ alkyl) and perfluoroalkyl such as perfluoro($C_{1-12}$alkyl), particularly perfluorooctanesulfonate, and perfluorononanesulfonate. A specifically preferred PAG is N-[(perfluorooctanesulfonyl) oxy]-5-norbornene-2,3-dicarboximide.

Sulfonate compounds are also suitable PAGs, particularly sulfonate salts. Two suitable agents for 193 nm and 248 nm imaging are the following PAGS 1 and 2:

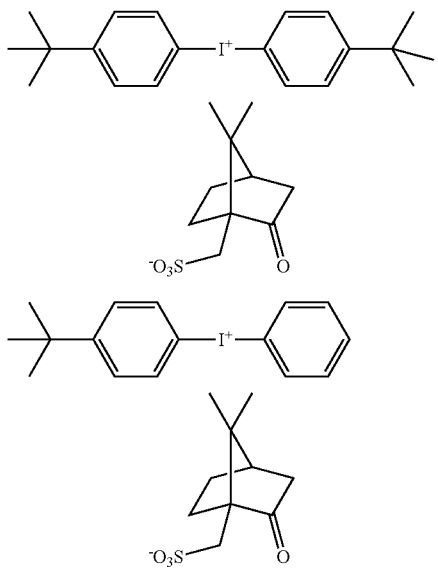

Such sulfonate compounds can be prepared as disclosed in European Patent Application 96118111.2 (publication number 0783136), which details the synthesis of above PAG 1.

Also suitable are the above two iodonium compounds complexed with anions other than the above-depicted camphorsulfonate groups. In particular, preferred anions include those of the formula $RSO_3$—where R is adamantane, alkyl (e.g. $C_{1-12}$ alkyl) and perfluoroalkyl such as perfluoro ($C_{1-12}$alkyl), particularly perfluorooctanesulfonate, and perfluorobutanesulfonate.

Other known PAGS also may be employed in photoresists used in accordance with the invention. Particularly for 193 nm imaging, generally preferred are PAGS that do not contain aromatic groups, such as the above-mentioned imidosulfonates, in order to provide enhanced transparency.

A preferred optional additive of resists of the invention is an added base, particularly tetrabutylammonium hydroxide (TBAH), or tetrabutylammonium lactate, which can enhance resolution of a developed resist relief image. For resists imaged at 193 nm, a preferred added base is a hindered amine such as diazabicyclo undecene or diazabicyclononene. The added base is suitably used in relatively small amounts, e.g. 0.03 to 5 percent by weight relative to the total solids.

Photoresists used in accordance with the invention also may contain other optional materials. For example, other optional additives include anti-striation agents, plasticizers, speed enhancers, etc. Such optional additives typically will be present in minor concentrations in a photoresist composition except for fillers and dyes which may be present in relatively large concentrations, e.g., in amounts of from 5 to 30 percent by weight of the total weight of a resist's dry components.

Negative-acting photoresists of the invention typically will contain a crosslinking component, preferably as a separate resist component. Amine-based crosslinkers often will be preferred such as a melamine, e.g. the Cymel melamine resins.

The photoresists used in accordance with the invention are generally prepared following known procedures. For example, a resist of the invention can be prepared as a coating composition by dissolving the components of the photoresist in a suitable solvent such as, e.g., a glycol ether such as 2-methoxyethyl ether (diglyme), ethylene glycol monomethyl ether, propylene glycol monomethyl ether; propylene glycol monomethyl ether acetate; lactates such as ethyl lactate or methyl lactate, with ethyl lactate being preferred; propionates, particularly methyl propionate, ethyl propionate and ethyl ethoxy propionate; a Cellosolve ester such as methyl Cellosolve acetate; an aromatic hydrocarbon such toluene or xylene; or a ketone such as methylethyl ketone, cyclohexanone and 2-heptanone. Typically the solids content of the photoresist varies between 5 and 35 percent by weight of the total weight of the photoresist composition. Blends of such solvents also are suitable.

Lithographic Processing

Liquid photoresist compositions may be applied to a substrate such as by spinning, dipping, roller coating or other conventional coating technique. When spin coating, the solids content of the coating solution can be adjusted to provide a desired film thickness based upon the specific spinning equipment utilized, the viscosity of the solution, the speed of the spinner and the amount of time allowed for spinning.

Photoresist compositions used in accordance with the invention are suitably applied to substrates conventionally used in processes involving coating with photoresists. For example, the composition may be applied over silicon wafers or silicon wafers coated with silicon dioxide for the production of microprocessors and other integrated circuit components. Aluminum-aluminum oxide, gallium arsenide, ceramic, quartz, copper, and glass substrates are also suitably employed.

Following coating of the photoresist onto a surface, it may be dried by heating to remove the solvent until preferably the photoresist coating is tack free.

As discussed, a coating composition of the invention is suitably applied above or over a photoresist composition layer by any of a variety of methods, including dip coating, roller coating, slot coating, spray coating, chemical vapor deposition or preferably spin coating.

The overcoated composition layer may be dried by thermal treatment if desired, but such a bake step is not necessary. It has been found that good results can be achieved with coating layers that are spun-dried.

As discussed above, preferred applied coating compositions of the invention can be removed including after such spin-drying such as with an aqueous composition include an alkaline developer composition or a fluoride salt composition. In the case of an alkaline developer, it is preferred that a metal free hydroxide salt is used. Typical examples of metal free salts, include but are not limited to tetramethylammonium, tetraethylammonium, tetrabutylammonium or tetraalkylammonium hydroxide. The concentration of the aqueous based developer is typically 0.26N but can increased or decreased depending on the need to control dissolution rate of the photoresist film. Typical fluoride salts include but are not limited to ammonium bifluoride, ammonium fluoride, tetrmethylammonium fluoride, or tetraalkylammonium fluoride. Typical concentrations of the fluoride salts are less than 1% and preferably less than 0.5% and more preferably less than 0.1%.

The overcoated composition layer may be applied at a variety of dried (spun-dry) layer thicknesses. If the composition is being employed as a top antireflective layer with an undercoated resist imaged at 193 nm, preferred top dried layer thicknesses include from 300 to 400 angstroms with a 350 angstrom layer thickness being particularly preferred. If the composition is being employed as a top antireflective layer with an undercoated resist imaged at 248 nm, preferred top layer dried thicknesses include from 400 to 500 angstroms with a 470 angstrom layer thickness being particularly preferred. If the composition is being employed as a top antireflective layer with an undercoated resist imaged at 365 nm, preferred top layer dried thicknesses include from 650 to 750 angstroms with a 700 angstrom layer thickness being particularly preferred.

The photoresist composition layer with overcoated coating composition layer is then suitably patterned exposed to activating radiation with the exposure energy typically ranging from 1 to 100 mJ/cm$^2$, dependent upon the exposure tool and the components of the photoresist composition. References herein to exposing a photoresist composition to radiation that is activating for the photoresist indicates that the radiation is capable of forming a latent image in the photoresist such as by causing a reaction of the photoactive component (e.g. producing photoacid from the photoacid generator compound).

As discussed above, photoresist compositions are preferably photoactivated by a short exposure wavelength, particularly a sub-300 and sub-200 nm exposure wavelength, with 248 nm and 193 nm being particularly preferred exposure wavelengths as well as EUV and 157 nm. Also suitable are photoresists that are imaged at higher wavelengths such as 365 nm and 436 nm.

The photoresist composition layer with overcoated composition layer also may be suitably exposed in an immersion lithography system, i.e. where the space between the exposure tool (particularly the projection lens) and the photoresist coated substrate is occupied by an immersion fluid, such as water or water mixed with one or more additives such as cesium sulfate which can provide a fluid of enhanced refractive index. Preferably the immersion fluid (e.g., water) has been treated to avoid bubbles, e.g. water can be degassed to avoid nanobubbles.

References herein to "immersion exposing" or other similar term indicates that exposure is conducted with such a fluid layer (e.g. water or water with additives) interposed between an exposure tool and the coated photoresist composition layer.

Following exposure, the coated substrate is preferably baked at temperatures ranging from 70° C. to 160° C.

As discussed above, following exposure, and before and/or after development, the coated substrate may be washed, e.g. with an aqueous composition that may contain one or more additives such as a fluoride compound. An aqueous ammonium fluoride composition can be useful. The wash solution may be suitably applied by spin-coating, or by other means.

Thereafter, the photoresist layer with overcoated coating composition layer is developed, preferably by treatment with an aqueous based developer such as quaternary ammonium hydroxide solutions such as a tetra-alkyl ammonium hydroxide solution; various amine solutions preferably a 0.26 N tetramethylammonium hydroxide. In general, development is in accordance with procedures recognized in the art.

Following development of the photoresist coating over the substrate, the developed substrate may be selectively processed on those areas bared of resist, for example ion implantation or by chemically etching or plating substrate areas bared of resist in accordance with procedures known in the art. For the manufacture of microelectronic substrates, e.g., the manufacture of silicon dioxide wafers, suitable etchants include a gas etchant, e.g. a halogen plasma etchant such as a chlorine or fluorine-based etchant such a $Cl_2$ or $CF_4/CHF_3$ etchant applied as a plasma stream. After such processing, resist may be removed from the processed substrate using known stripping procedures.

EXAMPLE 1

Composition Preparation and Coating

A coating composition of the invention was prepared by admixing the following components in the following amounts based on total composition weight:
1. 3.0 weight % of methylmethacrylate-mono-n-butylmaleate-isonorbornylacrylate terpolymer (ISP corporation)
2. 97.0 weight % 2-methyl-1-butanol This composition was spin-coated onto a dried photoresist layer that had been applied to a silicon wafer substrate. Water was dispensed on the coating and then removed. No change in film thickness or refractive index was observed. Subsequently 2.38% TMAH in water was dispensed on the film and it was completely removed within 5 seconds.

A variety of other polymers may be employed in place of the above methylmethacrylate-mono-n-butylmaleate-isonorbornylacrylate terpolymer to provide an effective top coating composition. In the following Table 1, listed are additional polymers that can be employed in the same manner (including amount) as the methylmethacrylate-mono-n-butylmaleate-isonorbornylacrylate terpolymer to provide a coating composition.

TABLE 1

Alternate polymers with low water solubility and good base solubility suitable as a matrix polymer

| Composition | Monomer Ratio | Class |
|---|---|---|
| Poly(vinylalcohol-co-vinylacetate) | | Vinyl |
| Poly(methacrylic acid-co-methyl methacrylate-co-2-acrylamido-2-methylpropanesulfonic acid) | 27/70/3 | Acrylic |
| Poly(methacrylic acid-co-hydroxy ethyl acrylate-co-2-acrylamido-2-methylpropanesulfonic acid) | 27/70/3 | Acrylic |
| Poly(methacrylic acid-co-methyl methacrylate) | 20/80 | Acrylic |
| Poly(vinyl acetate-co-butyl maleate-co-isobornyl acrylate) | | Maleate |
| Poly(tert butyl acrylate-co-methyl methacrylate-co-methacrylic acid) | 40/45/5 | Acrylic |
| Poly(tert butyl acrylate-co-methyl methacrylate-co-methacrylic acid) | 40/45/10 | Acrylic |
| Poly(tert butyl acrylate-co-methyl methacrylate-co-methacrylic acid) | 55/45/15 | Acrylic |
| Poly(tert butyl acrylate-co-methyl methacrylate-co-methacrylic acid) | 55/45/20 | Acrylic |
| Poly(tert butyl acrylate-co-methyl methacrylate-co-acrylic acid) | 40/45/5 | Acrylic |
| Poly(tert butyl acrylate-co-methyl methacrylate-co-acrylic acid) | 40/45/10 | Acrylic |

TABLE 1-continued

Alternate polymers with low water solubility and good base solubility suitable as a matrix polymer

| Composition | Monomer Ratio | Class |
|---|---|---|
| Poly(tert butyl acrylate-co-methyl methacrylate-co-acrylic acid) | 55/45/15 | Acrylic |
| Poly(tert butyl acrylate-co-methyl methacrylate-co-acrylic acid) | 55/45/20 | Acrylic |
| Poly(methacrylic acid-co-methyl methacrylate-co-2-acrylamido-2-methylpropanesulfonic acid) | 27/70/3 | Acrylic |
| Poly(tert butyl methacrylate-co-methyl acrylate-co-methacrylic acid) | 40/45/10 | Acrylic |
| Poly(tert butyl methacrylate-co-methacrylic acid) | 80/20 | Acrylic |
| Poly(methacrylic acid-co-methyl methacrylate-co-2-acrylamido-2-methylpropanesulfonic acid) | 25/70/5 | Acrylic |
| Poly(tert butyl methacrylate-co-methyl methacrylate-co-methacrylic acid) | 40/45/5 | Acrylic |
| Poly(tert butyl methacrylate-co-methyl methacrylate-co-methacrylic acid) | 40/45/10 | Acrylic |
| Poly(tert butyl methacrylate-co-methyl methacrylate-co-methacrylic acid) | 55/45/15 | Acrylic |
| Poly(tert butyl methacrylate-co-methyl methacrylate-co-methacrylic acid) | 55/45/20 | Acrylic |
| Poly(styrene-co-maleic anhydride) | 50/50 | Maleate |
| Poly(methyl vinyl ether-alt-maleic anhydride) | 50/50 | Maleate |
| Poly(tert-butyl acrylate-co-ethyl acrylate-co-methacrylic acid | 50/50 | |
| Poly(styrene-co-maleic anhydride), partially esterified | 50/50 | Maleate |
| Poly(maleic anhydride-alt-1-octadecene) | 50/50 | Maleate |
| Poly(isobutylene-alt-maleic anhydride) | 50/50 | Maleate |
| Poly(isobutylene-alt-maleic anhydride), partial ammonium salt | 50/50 | Maleate |

EXAMPLE 2

Composition Preparation and Coating

A further coating composition of the invention was prepared by admixing the following components in the following amounts based on total composition weight:
1. 3.0 weight % methacrylic acid-methylmethacrylate copolymer (20/80)
2. 0.1% p-toluene sulfonic acid
3. 0.1% PolyFox-656 Fluorinated surfactant
3. 96.8 weight % 2-methyl-1-butanol This composition was spin-coated onto a dried photoresist layer that had been applied to a silicon wafer substrate. The coating quality was good was less than one percent coating layer thickness variation across the applied coating layer. Water was dispensed on the coating and then removed. No change in film thickness or refractive index was observed. Subsequently 2.38% TMAH in water was dispensed on the film and it was completely removed within 5 seconds.

EXAMPLE 3

Composition Preparation and Lithographic Processing

A further coating composition of the invention was prepared by admixing the following components in the following amounts based on total composition weight:
1. 0.75 weight % poly(acrylic acid-co-methylmethacrylate) (30/70)
2. 2.25 weight % of methylmethacrylate-mono-n-butylmaleate-isonorbornylacrylate terpolymer (ISP corporation)
3. 0.1% p-toluene sulfonic acid
4. 0.1% PolyFox-656 Fluorinated surfactant
5. 76.8 weight % 2-methyl-1-butanol
6. 10.00 weight % decane This composition was spin-coated onto a dried photoresist layer that had been applied to a silicon wafer substrate. This sample had excellent coat quality. The refractive index of the film was 1.66 at 193 nm wavelength. Water was dispensed on the coating and then removed. No change in film thickness or refractive index was observed. Subsequently 2.38% TMAH in water was dispensed on the film and it was completely removed within 5 seconds.

EXAMPLE 4

Composition Preparation and Lithographic Processing

A further coating composition of the invention was prepared by admixing the following components in the following amounts based on total composition weight:
1. 0.5 weight % poly(allylhexfluoroalcohol-co-methylmethacrylate) (40/60)
2. 2.5 weight % of methylmethacrylate-mono-n-butylmaleate-isonorbornylacrylate terpolymer (ISP corporation)
3. 0.1% p-toluene sulfonic acid
5. 76.8 weight % 2-methyl-1-butanol
6. 10.00 weight % cyclohexane This composition was spin-coated onto a dried photoresist layer that had been applied to a silicon wafer substrate. This sample had excellent coat quality. The refractive index of the film was 1.64 at 193 nm wavelength. Water was dispensed on the coating and then removed. No change in film thickness or refractive index was observed. Subsequently 2.38% TMAH in water was dispensed on the film and it was completely removed within 5 seconds.

A variety of other fluorinated materials may be employed in place of the above poly(allylhexfluoroalcohol-co-methylmethacrylate) (40/60) material to provide an effective top coating composition. In the following Table 2, listed are additional polymers that can be employed in the same manner (including amount) as the poly(allylhexfluoroalcohol-co-methylmethacrylate) (40/60) to provide a coating composition.

TABLE 2

Alternate fluoropolymers suitable for use as a surfactant or surface modification agent in the present invention include

| Composition | Monomer Ratio |
|---|---|
| Poly(pentafluoropropylacrylate-co-t-butyl methacrylate-co-trimethylpropanetrimethacrylate) | 50/40/10 |
| Poly(pentafluoropropylacrylate-co-t-butyl acrylate-co-ethylenglycoldimethacrylate) | 50/40/10 |
| Poly(pentafluoropropylacrylate-co-t-butyl acrylate-co-ethylenglycoldimethacrylate) | 60/30/10 |
| Poly(pentafluoropropylacrylate-co-methacrylic acid-co-ethylenglycoldimethacrylate) | 50/40/10 |
| Poly(allylhexfluoro alcohol-co-methacrylic acid-co-ethylenglycoldimethacrylate) | 60/30/10 |
| Poly(allylhexfluoro alcohol-co-t-butyl acrylate-co-ethylenglycoldimethacrylate) | 50/40/10 |
| Poly(allylhexfluoro alcohol-co-t-butylmethacrylate-co-ethylenglycoldimethacrylate) | 50/40/10 |
| Poly(allylhexfluoro alcohol-co-methacrylic acid-co-trimethylpropanetrimethacrylate) | 60/30/10 |
| Poly(hexafluoro-2-propyl methacrylate-co-t-butyl methacrylate-co-trimethylpropanetrimethacrylate) | 60/30/10 |
| Poly(trifluoroethyl acrylate-co-t-butyl methacrylate-co-trimethylpropanetrimethacrylate) | 50/40/10 |
| Poly(hexafluoro-2-propyl acrylate-co-t-butyl methacrylate-co-trimethylpropanetrimethacrylate) | 50/40/10 |
| Poly(trifluoroethyl methacrylate-co-t-butyl methacrylate-co-trimethylpropanetrimethacrylate) | 50/40/10 |
| Poly(heptafluoro-2-propyl acrylate-co-t-butyl methacrylate-co-trimethylpropanetrimethacrylate) | 50/40/10 |
| Poly(pentafluoropropylacrylate-co-t-butyl methacrylate-co-trimethylpropanetrimethacrylate) | 60/30/10 |
| Poly(heptafluoro-2-propyl allylether-co-t-butyl methacrylate-co-trimethylpropanetrimethacrylate) | 50/40/10 |
| Poly(Bis (hexafluoro-2-propyl) itaconate-co-t-butyl methacrylate-co-trimethylpropanetrimethacrylate) | 60/30/10 |
| Poly(3,5 bis(hexafluoro-2-hydroxy-2-propyl)cyclohexylmethacrylate-co-t-butyl methacrylate-co-trimethylpropanetrimethacrylate) | 50/40/10 |
| Poly(pentafluoropropylacrylate-co-ethylcylcopentylmethacrylate-co-trimethylpropanetrimethacrylate) | 60/30/10 |
| Poly(heptafluoro-2-propyl allylether-co ethylcylcopentylmethacrylate-co-trimethylpropanetrimethacrylate) | 50/40/10 |
| Poly(pentafluoropropylacrylate-co-ethylcylcopentylacrylate-co-trimethylpropanetrimethacrylate) | 55/45/15 |
| Poly(3,5 bis(hexafluoro-2-hydroxy-2-propyl)cyclohexylmethacrylate-co-ethylcylcopentylmethacrylate-co-trimethylpropanetrimethacrylate) Poly(3,5 bis(hexafluoro-2-hydroxy-2-propyl)cyclohexylmethacrylate-co-ethylcylcopentylmethacrylate) | 55/45/20 |

EXAMPLE 5

Composition Preparation and Lithographic Processing

A further coating composition of the invention was prepared by admixing the following components in the following amounts based on total composition weight:

1. 0.5 weight % allylhexfluoro alcohol-methylmethacrylate-copolymer (40/60)
2. 2.5 weight % of methylmethacrylate-mono-n-butylmaleate-isonorbornylacrylate terpolymer (ISP corporation)
3. 0.1% p-toluene sulfonic acid
4. 0.1% PolyFox-656 Fluorinated surfactant
5. 76.8 weight % 2-methyl-1-butanol
6. 10.00 weight % cyclohexane This composition was spin-coated onto a dried photoresist layer that had been applied to a silicon wafer substrate. This sample had excellent coat quality. The refractive index of the film was 1.64 at 193 nm wavelength. Water was dispensed on the coating and then removed. No change in film thickness or refractive index was observed. Subsequently 2.38% TMAH in water was dispensed on the film and it was completely removed within 5 seconds.

EXAMPLE 6

Composition Preparation and Lithographic Processing

A further coating composition of the invention was prepared by admixing the following components in the following amounts based on total composition weight:

1. 0.5 weight % allylhexfluoro alcohol-methylmethacrylate-copolymer (40/60)
2. 2.5 weight % of methylmethacrylate-mono-n-butylmaleate-isonorbornylacrylate terpolymer (ISP corporation)
3. 0.1% p-toluene sulfonic acid
4. 0.1% Surfynol 440
5. 76.8 weight % 2-methyl-1-butanol
6. 10.00 weight % cyclohexane This composition is spin-coated onto a dried photoresist layer that had been applied to a silicon wafer substrate. This sample had excellent coat quality. The refractive index of the film was 1.64 at 673 nm wavelength. Water was dispensed on the coating and then removed. No change in film thickness or refractive index was observed. Subsequently 2.38% TMAH in water was dispensed on the film and it was completely removed within 5 seconds.

TABLE 3

Alternate commercial surfactants and surface modification agents were evaluated by substitution for Surfynol 440 in Example 5. The solution stability and coating quality were summarized below.

| Tradename | Class | Amount weight % | Type |
|---|---|---|---|
| Dynol 604 | Ethyloxylate acetylenic diol | 0.01 | Nonionic |
| Pluronic 25R2 | Polypropylene/ethylene oxide polymer | 0.01 | Nonionic |
| Polyfox151N | Fluorinated oligomer | 0.01 | Nonionic |
| Polyfox156A | Fluorinated oligomer | 0.1 | Anionic |
| Silwet 7604 | Siloxane-PEO | 0.01 | Nonionic |
| | Ethoxylated phenol | 0.01 | Nonionic |
| | Polyethyleneglycol-propyltriethoxysilane | 0.01 | Nonionic |
| Surfynol 465 | Ethyloxylate acetylenic diol | 0.01 | Nonionic |
| Surfynol 485 | Ethyloxylate acetylenic diol | 0.01 | Nonionic |
| Geminol 100 | Acetylenic diol | 0.05 | Nonionic |
| Megaface R08 | Perfluoroalkyltelemer | 0.02 | Nonionic |
| Megaface R08 | Fluoro alkyl telemer | 0.02 | Nonionic |
| Envirogen AE-01 | Alkyl ester | 0.05 | Nonionic |

Solution is stable if no precipitate was observed upon standing at room temperature for 24 hours. Good coating quality is defined as no haze or phase separation observed upon coating of a film on a substrate. Water was dispensed on the coating and then removed. No change in film thickness or refractive index was observed. Subsequently 2.38% TMAH in water was dispensed on the film and it was completely removed within 5 seconds.

EXAMPLE 7

Composition Preparation and Coating

A further coating composition of the invention is prepared by admixing the following components in the following amounts based on total composition weight:
1. 0.5 weight % allylhexfluoro alcohol-methylmethacrylate-copolymer (40/60)
2. 2.5 weight % of methylmethacrylate-mono-n-butylmaleate-isonorbornylacrylate terpolymer (ISP corporation)
3. 0.5 weight % 15 nm colloidal silica in hydroxymethylbutyrate and water
4. 0.1% p-toluene sulfonic acid
5. 0.1% PolyFox-656 Fluorinated surfactant
6. 76.8 weight % 2-methyl-1-butanol
7. 10.00 weight % cyclohexane This composition is spin-coated onto a dried photoresist layer that has been applied to a silicon wafer substrate. This sample is expected to have excellent coat quality. Water was dispensed on the coating and then removed. No change in film thickness or refractive index was observed. Subsequently 2.38% tetramethyl ammonium hydroxide (TMAH) in water was dispensed on the film and it was completely removed within 5 seconds.

EXAMPLE 8

Composition Preparation and Coating

A coating composition of the invention is prepared by admixing the following components in the following amounts based on total composition weight:
1. 0.5 weight % allylhexfluoro alcohol-methylmethacrylate-copolymer (40/60)
2. 2.5 weight % of methylmethacrylate-mono-n-butylmaleate-isonorbornylacrylate terpolymer (ISP corporation)
3. 0.5 weight % 15 nm colloidal hafnia in water
4. 0.1% p-toluene sulfonic acid
5. 0.1% PolyFox-656 Fluorinated surfactant
6. 76.8 weight % 2-methyl-1-butanol This composition is spin-coated onto a dried photoresist layer that has been applied to a silicon wafer substrate. This sample has good coat quality. The refractive index of the film is 1.8 at 193 nm wavelength. No change in film thickness or refractive index was observed. Subsequently 2.38% TMAH in water was dispensed on the film and it was completely removed within 5 seconds

EXAMPLE 9

Defect Reduction

A 193 nm chemically-amplified positive photoresist was spin coated onto silicon wafers substrate and those coated wafers were soft-baked on a hotplate to remove solvent.

For one resist-coated wafer, a coating composition of type disclosed in Example 1 was spin coated. For another resist-coated wafer, an overcoating coating composition was not applied.

Both wafers were exposed to patterned 193 nm radiation under water immersion conditions, post-exposure baked and then developed with an aqueous alkaline developer solution. The wafer that had been coated with the composition of the type disclosed in Example 5 showed fewer post-development—watermark—defects (discernable residues) than the wafer that had not been coated. Both wafers had the same exposure latitude and pattern fidelity.

What is claimed is:
1. A coated substrate comprising:
 (a) a coating layer of a photoresist composition;
 (b) above the photoresist composition, an applied composition comprising: (i) a resin component, and wherein at least 50 weight percent of all polymeric materials present in the coating composition comprise one or more resins that are at least substantially free of fluorine; (ii) an acid or acid generator compound; and (iii) a fluorinated component.
2. The substrate of claim 1 wherein the resin component comprises an acrylate polymer that is at least substantially free of fluorine.
3. The substrate of claim 1 wherein the applied composition comprises an acid generator compound.
4. The substrate of claim 1 wherein the applied composition comprises a polymer that has one or more non-acrylate repeat units.
5. A method for processing an electronic device substrate, comprising:
 (a) applying a photoresist layer on substrate;

(b) applying above the photoresist layer a composition comprising: (i) a resin component, and wherein at least 50 weight percent of all polymeric materials present in the coating composition comprise one or more resins that are at least substantially free of fluorine; (ii) an acid or acid generator compound; and (iii) a fluorinated component.

6. The method of claim 5 wherein the resin comprises (1) an acrylate polymer that is at least substantially free of fluorine; and (2) one or more of (a) a fluorinated resin, (b) acid or acid generator compound and (c) surfactant.

7. The method of claim 5 wherein the applied composition comprises acid generator compound.

8. The method of claim 5 further comprising immersion exposing the photoresist layer.

* * * * *